United States Patent
Lim et al.

(10) Patent No.: US 9,196,578 B1
(45) Date of Patent: Nov. 24, 2015

(54) COMMON PIN FOR MULTI-DIE SEMICONDUCTOR PACKAGE

(71) Applicants: Sheau Mei Lim, Taman Maju Ria (MY); Meng Kong Lye, Shah Alam (MY); Pei Fan Tong, Kuala Lumpur (MY)

(72) Inventors: Sheau Mei Lim, Taman Maju Ria (MY); Meng Kong Lye, Shah Alam (MY); Pei Fan Tong, Kuala Lumpur (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/459,337

(22) Filed: Aug. 14, 2014

(51) Int. Cl.
    *H01L 23/495* (2006.01)
(52) U.S. Cl.
    CPC .... *H01L 23/49575* (2013.01); *H01L 23/49503* (2013.01)
(58) Field of Classification Search
    CPC ............ H01L 2224/48091; H01L 2224/48247
    USPC ............................ 257/666–676; 438/111–123
    See application file for complete search history.

(56) References Cited

U.S. PATENT DOCUMENTS

| | | |
|---|---|---|
| 5,229,639 A | 7/1993 | Hansen et al. |
| 6,114,749 A | 9/2000 | Chia |
| 6,528,868 B1 * | 3/2003 | Weiblen et al. ............... 257/669 |
| 7,618,896 B2 | 11/2009 | Joshi et al. |
| 7,875,963 B1 | 1/2011 | Kim et al. |
| 8,436,460 B1 | 5/2013 | Gamboa et al. |
| 8,575,742 B1 | 11/2013 | Kim et al. |
| 2008/0024102 A1 * | 1/2008 | Hebert et al. .................. 323/282 |
| 2010/0290202 A1 * | 11/2010 | Sasaki et al. .................. 361/767 |
| 2011/0233746 A1 * | 9/2011 | Liu et al. ....................... 257/676 |
| 2013/0082371 A1 * | 4/2013 | Chen ............................. 257/676 |

* cited by examiner

*Primary Examiner* — Jami M Valentine
(74) *Attorney, Agent, or Firm* — Charles Bergere

(57) ABSTRACT

A semiconductor package has multiple dies and an interior power bar that extends within an interior space formed within the die flag between the dies. The bond pads located on the interior side of each die are wire-bonded to the interior power bar. Some embodiments may have more than two dies and/or more than one interior power bar between each pair of adjacent dies.

4 Claims, 3 Drawing Sheets

COMMON PIN FOR MULTI-DIE SEMICONDUCTOR PACKAGE

BACKGROUND OF THE INVENTION

The present invention relates generally to semiconductor packages and, more particularly, to improved connections for multi-die semiconductor packages.

In semiconductor packages that have more than one die, such as the semiconductor package 100 shown in FIG. 1, the dies 101 have bond pads 102 that are electrically connected with bond wires 103 to leads 104, power bars 105, and a die flag 106. The leads 104 connected to the die bond pads 102 provide signals to and from the dies 101. The power bars 105, which are formed as part of the lead frame 107, provide power to the dies 101. The die flag 106 can provide a ground for the dies 101.

The power bars 105 are located near the periphery 108 of the die flag 106 of the semiconductor package 100. The drawback to having the power bars 105 located near the periphery 108 is that it is difficult to connect bond wires to the bond pads 102 located on those portions of the dies 101 that are not located near the periphery 108 of the die flag 106 and are not proximate to the power bars 105. Further, the die pads 102 connected to the power bars 105 have to use longer lengths of bond wire, which can cause issues such as wire sag.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

In certain embodiments of the present invention, a common pin is provided that extends between at least two dies in a multi-die package in order to provide relatively easy connections for die bond pads that are not located near the periphery of the die flag.

In one embodiment, a lead frame for a semiconductor package is provided. The lead frame comprises a partially segmented die flag having two die pads separated by an interior space; at least one power bar located in the interior space between the two die pads; and a plurality of peripheral leads surrounding the die flag.

Figure 1:
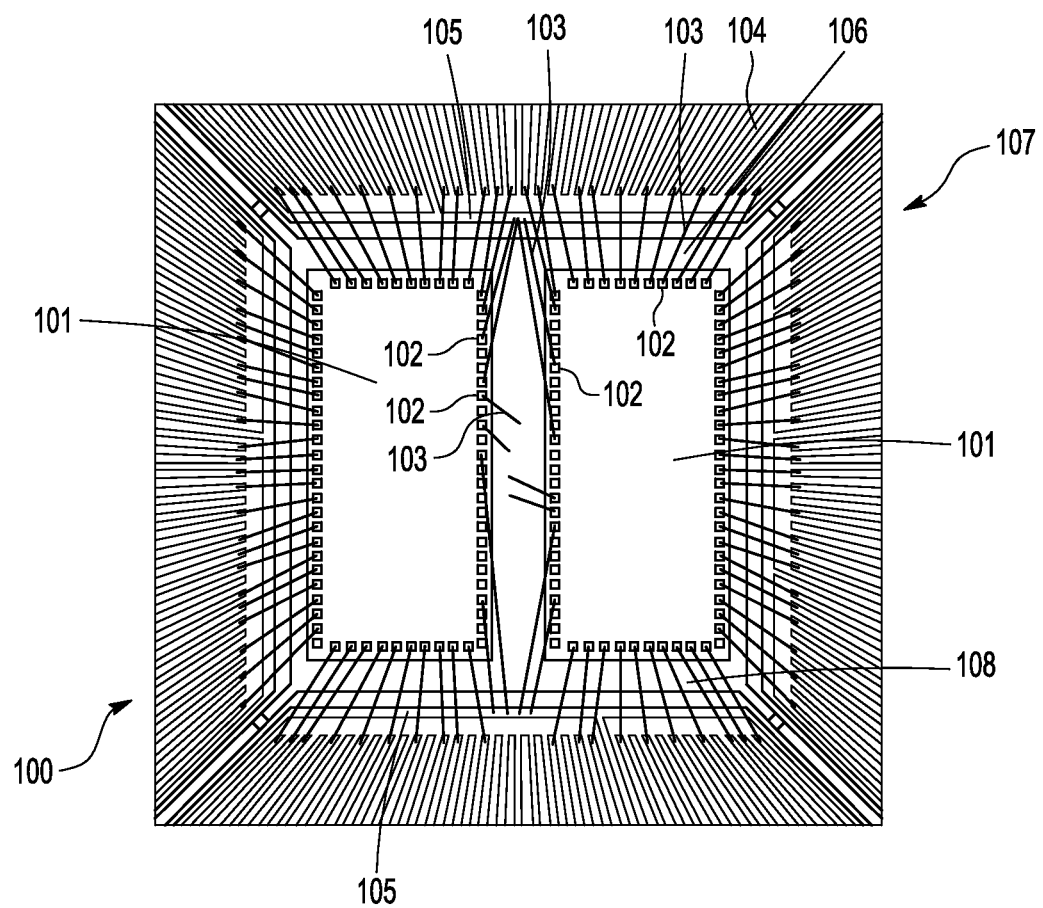
FIG. 1 is a simplified top-down view of a conventional semiconductor package having power bars located near the periphery of a die flag.
Figure 2:
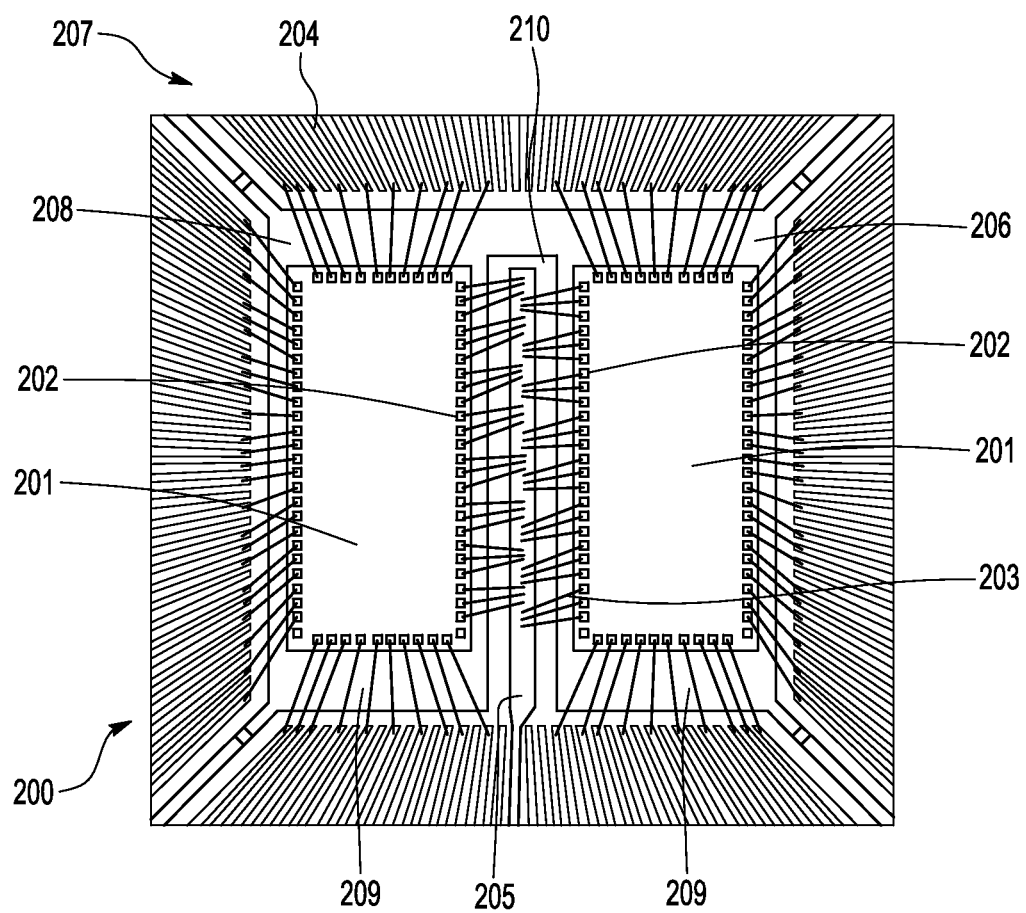
FIG. 2 is a simplified top-down view of a semiconductor package made in accordance with an embodiment of the present invention.

Referring now to FIG. 2, a multi-die semiconductor package 200 in accordance with an embodiment of the present invention is shown. The semiconductor package 200 has two dies 201, which each have bond pads 202 around a periphery of their top or active surfaces. The die bond pads 202 are electrically connected with bond wires 203 to peripheral leads 204 that are located at an exterior periphery of the package 200.

The dies 201 are respectively die-bonded to two die pads 209 of a partially segmented die flag 206 of a lead frame 207. The lead frame 207 also has an interior power bar 205 that extends between the two die pads 209 of the die flag 206. The power bar 205 also extends to the exterior periphery of the package 200—that is the power bar 205 has one or more integral leads 204.

The two dies 201 shown in FIG. 2 are quadrilaterals, when viewed top down, with three of the four sides of each die 201 facing the exterior periphery 208 of the die flag 206. The bond pads 202 located on these three exterior sides of each die 201 are wire-bonded to the leads 204. These bond pads 202 may receive and/or transmit signals to and/or from outside the semiconductor device via the connections with the leads 204.

Each die 201 also has one interior side facing the interior power bar 205 located within an interior space 210 formed between the two die pads 209 of the die flag 206. The interior power bar 205 may be formed as part of the lead frame 207. The interior space 210, when viewed top-down, has a rectangular shape that extends along the lengths of the dies 201 and in the embodiment shown in FIG. 2, the interior space 210 is closed at one end.

The bond pads 202 that are located on the interior side of each die 201 are wire-bonded to the interior power bar 205. The interior power bar 205 is electrically isolated from the two die pads 209. The interior power bar 205 is designed to supply a power-supply voltage to the dies 201. Furthermore, the interior power bar 205 permits connection between the dies 201. The interior power bar 205 also permits short wire-bond connections to the bond pads 202 located on the interior sides of the dies 201.

Figure 3:
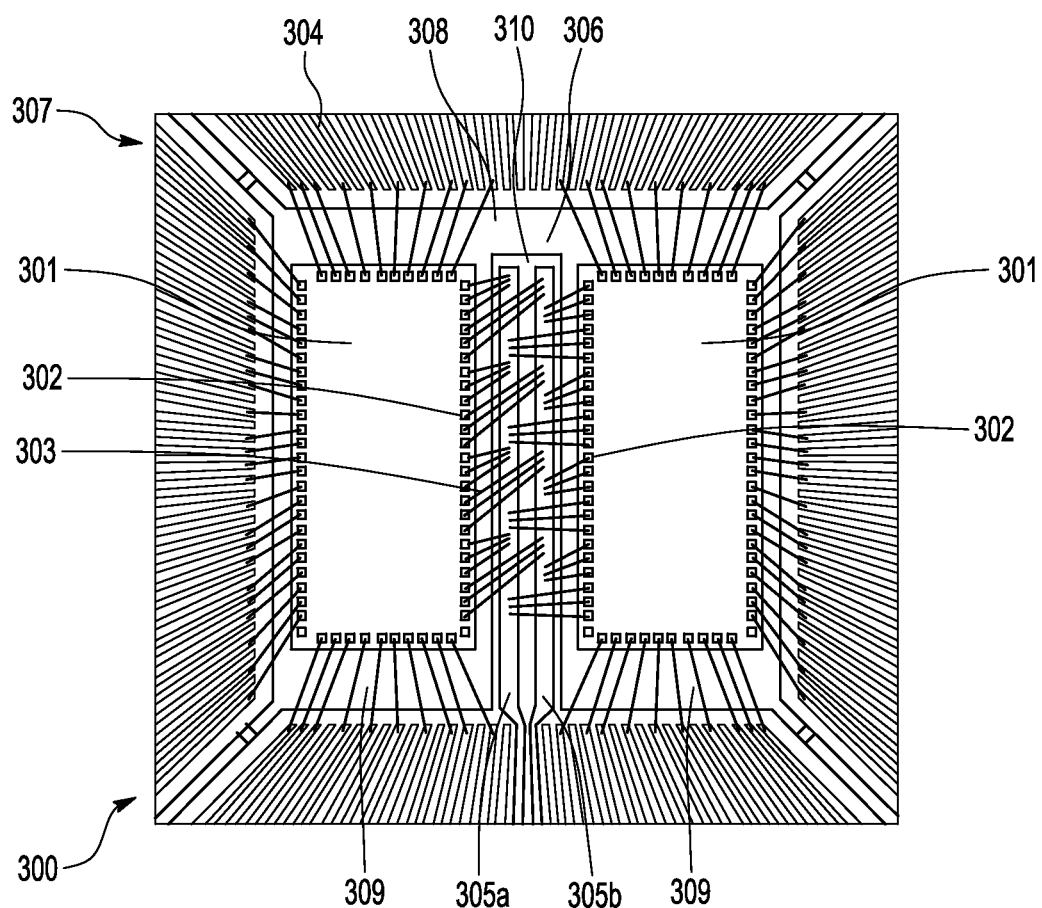
FIG. 3 is a simplified top-down view of a semiconductor package made in accordance with another embodiment of the present invention.

FIG. 3 shows a semiconductor package 300 in accordance with another embodiment of the present invention. In the embodiment shown, elements numbered similarly to those in FIG. 2 represent like components of the invention.

The semiconductor package 300 has two dies 301 respectively located on two die pads 309 of a partially segmented die flag 306. Bond pads 302 located on the three exterior sides of each die 301 are wire-bonded with bond wires 303 to the peripheral leads 304.

The semiconductor package 300 further has an interior space 310 formed between the two die pads 309 of the die flag 308 that is sized to accommodate two interior power bars 305a and 305b. The interior power bars 305a and 305b can be used to supply two different voltages, such as 5V and 3.3V or 3.3V and ground. In the embodiment shown, the interior power bars 305a and 305b are electrically isolated from each other and from the rest of the lead frame 307 (i.e., the die pads 309). Some (or all) of the bond pads 302 that are located on the interior side of each die 301 are wire-bonded to either one of interior power bars 305a and 305b. The interior power bars 305a and 305b also have integral peripheral leads 304.

The lead frames 207, 307 described above are formed of a conductive metal like copper and may be either plated or unplated, as is known in the art.

While embodiments shown herein have one or two interior power bars, it should be understood that there may be more than two interior power bars, depending on the design of the semiconductor package.

While embodiments shown herein have two dies respectively mounted to the two die pads of a partially segmented die flag, other embodiments may have more than two dies respectively mounted to more than two die pads of a partially segmented die flag, wherein one or more power bars are located in the interior space between each two adjacent die pads.

In the invention described herein, permitting ease of connections in the interior of multi-die semiconductor packages permits the packages to be smaller since a package may place more bond pads in the interior space and not relegate them to the exterior periphery of the die flag in order to achieve connections. Furthermore, providing an interior power bar can permit easier connections between the dies of the semiconductor device. In addition, by eliminating the peripheral power bars, the total amount of expensive bond wire needed to connect bond pads on the exterior sides of the dies to the peripheral leads may be reduced, as may the overall lateral dimensions of the semiconductor package.

A lead frame is a collection of metal leads and possibly other elements (e.g., die paddles, power bars) that is used in semiconductor packaging for assembling a single packaged semiconductor device. Prior to assembly into a packaged device, a lead frame may have support structures (e.g., a rectangular metal frame) that keep those elements in place. During the assembly process, the support structures may be removed. As used herein, the term "lead frame" may be used to refer to the collection of elements before assembly or after assembly, regardless of the presence or absence of those support structures.

Although the invention has been described using relative terms such as "down," "out," "top," "bottom," "over," "above," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A semiconductor package, comprising:
a partially segmented die flag comprising two die pads separated by an interior space;
first and second power bars located side-by-side located in the interior space between the two die pads;
a plurality of peripheral leads surrounding the die flag, wherein at least one of the peripheral leads is integral with the at least one power bar;
two dies respectively mounted to the two die pads of the die flag;
a first plurality of bond wires connecting bond pads on exterior sides of each die to the peripheral leads;
a second plurality of bond wires connecting bond pads on an interior side of each die to the at least one power bar, wherein a first subset of the second plurality of bond wires connect a first subset of the bond pads on the interior side of each die to the first power bar, and a second subset of the second plurality of bond wires connect a second subset of the bond pads on the interior side of each die to the second power bar.

2. The semiconductor package of claim 1, wherein the first and second power bars provide two different external voltages to the two dies.

3. The semiconductor device of claim 1, wherein the interior space is rectangular shaped.

4. The semiconductor device of claim 1, wherein the interior space is closed at one end.

\* \* \* \* \*